United States Patent [19]
Imaeda et al.

[11] Patent Number: 6,074,477
[45] Date of Patent: Jun. 13, 2000

[54] PROCESS AND AN APPARATUS FOR PRODUCING A COMPOSITE OXIDE SINGLE CRYSTAL BODY

[75] Inventors: Minoru Imaeda, Nagoya; Tsuguo Fukuda; Kiyoshi Shimamura, both of Sendai; Tatsuo Kawaguchi, Motosu-Gun, all of Japan

[73] Assignee: NGK Insulators, Ltd., Japan

[21] Appl. No.: 09/041,479

[22] Filed: Mar. 12, 1998

[30] Foreign Application Priority Data

Mar. 12, 1997 [JP] Japan ..................................... 9-057754

[51] Int. Cl.⁷ .................................................. C30B 15/34
[52] U.S. Cl. .............................. 117/13; 117/23; 117/208; 117/910; 117/948
[58] Field of Search ..................................... 117/910, 948, 117/208, 13, 23

[56] References Cited

U.S. PATENT DOCUMENTS 4,242,553  12/1980  Berkman et al. ......................... 117/904

FOREIGN PATENT DOCUMENTS

| 0 056 262 | 7/1982 | European Pat. Off. . |
| 0 733 728 A2 | 9/1996 | European Pat. Off. . |
| 4/280891 | 6/1992 | Japan . |
| 6/345588 | 12/1994 | Japan . |

OTHER PUBLICATIONS

Rudolph et al., "The radial selectivity of in–situ core doped crystal rods grown by the double die EFG method" Crystal. Res. Technology vol. 29(6) abstract only p. 801, 1994.

Vasil 'EV et al: "two layer single crystal fiber waveguides" Soviet Journal of Quantum Electronics., vol. 15, No. 12, Dec. 1985, Woodbury NY US, pp. 1646–1647, XP002066401.

Patent Abstracts of Japan vol. 14, No. 4 (P–986), Jan. 9, 1990 & JP 01 257802 A (Nippon Telegr. & Teleph. Corp. NTT).

Shimamura: "A new crystal growth method for in–situ core doping" Journal of Crystal Growth., vol. 142, No. 3/4, Sep. 1994, Amsterdam NL, pp. 400–402, XP000468435.

Epelbaum et al: "A double die modification of micro pulling down method for in situ clad/core doping of fiber crystal" Journal of Crystal Growth., vol. 179, Aug. 1997, Amsterdam, NL, pp. 559–566, XP004096616.

*Primary Examiner*—Robert Kunemund
*Attorney, Agent, or Firm*—Wal Marjama Bilinski & Burr

[57] ABSTRACT

A process is disclosed for producing an integrated composite oxide single crystal body composed of a core portion made of an oxide single crystal and a clad portion integrated with the core portion and made of another oxide single crystal having a composition different from that of the oxide single crystal constituting the core portion, the process comprising the steps of: (1) preparing a first melt in a first crucible by melting a first material for a first oxide single crystal to constitute the core portion inside the first crucible, (2) preparing a second melt inside a second crucible by melting a second material for a second oxide single crystal to constitute the clad portion inside the second crucible, (3) contacting a seed crystal to the first and second melts, (4) pulling down the first melt through a pull-out opening of the first crucible, (5) pulling down the second melt through a pull-out opening of the second crucible and contacting the pulled-down second melt with a pulled-down portion of the first melt, and (6) integrally pulling down the first and second melts.

27 Claims, 7 Drawing Sheets

FIG._2a
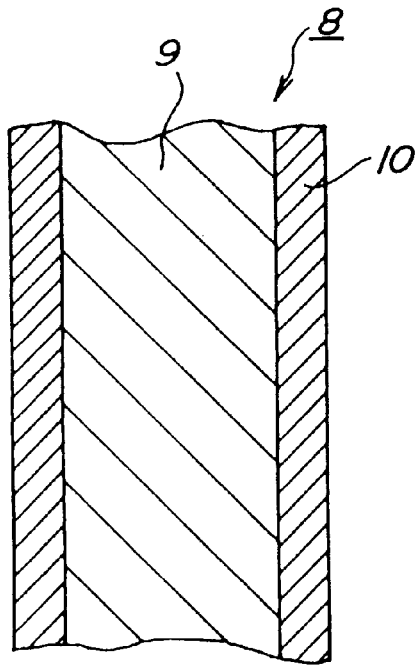
FIG._2b
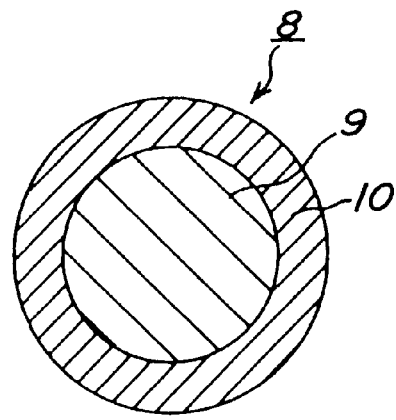
FIG._2c
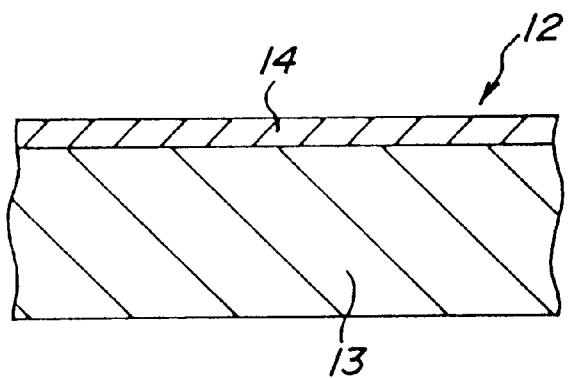
FIG._2d
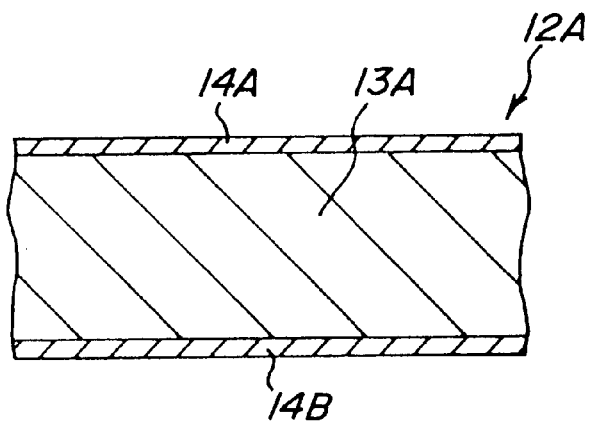

FIG_3
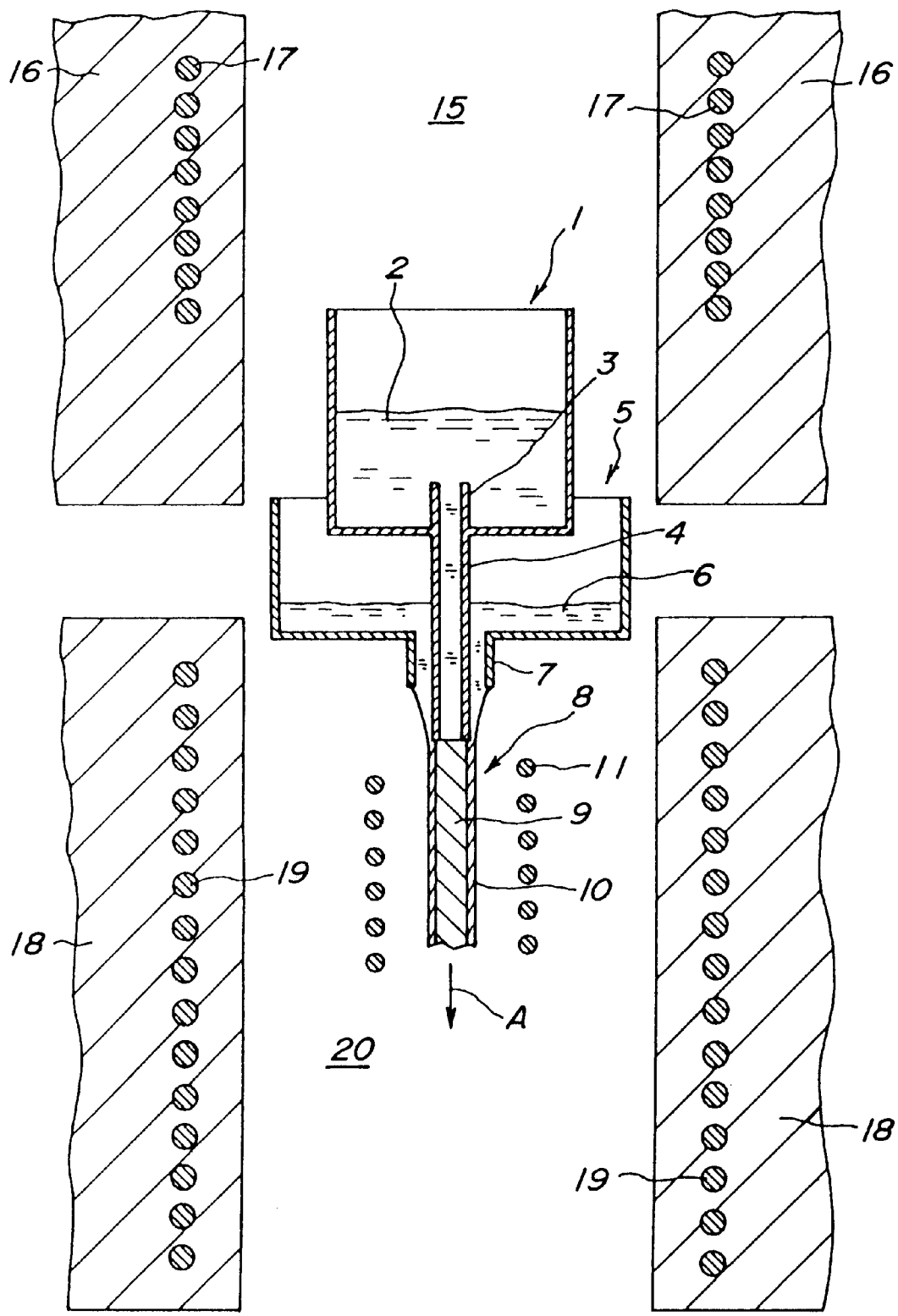

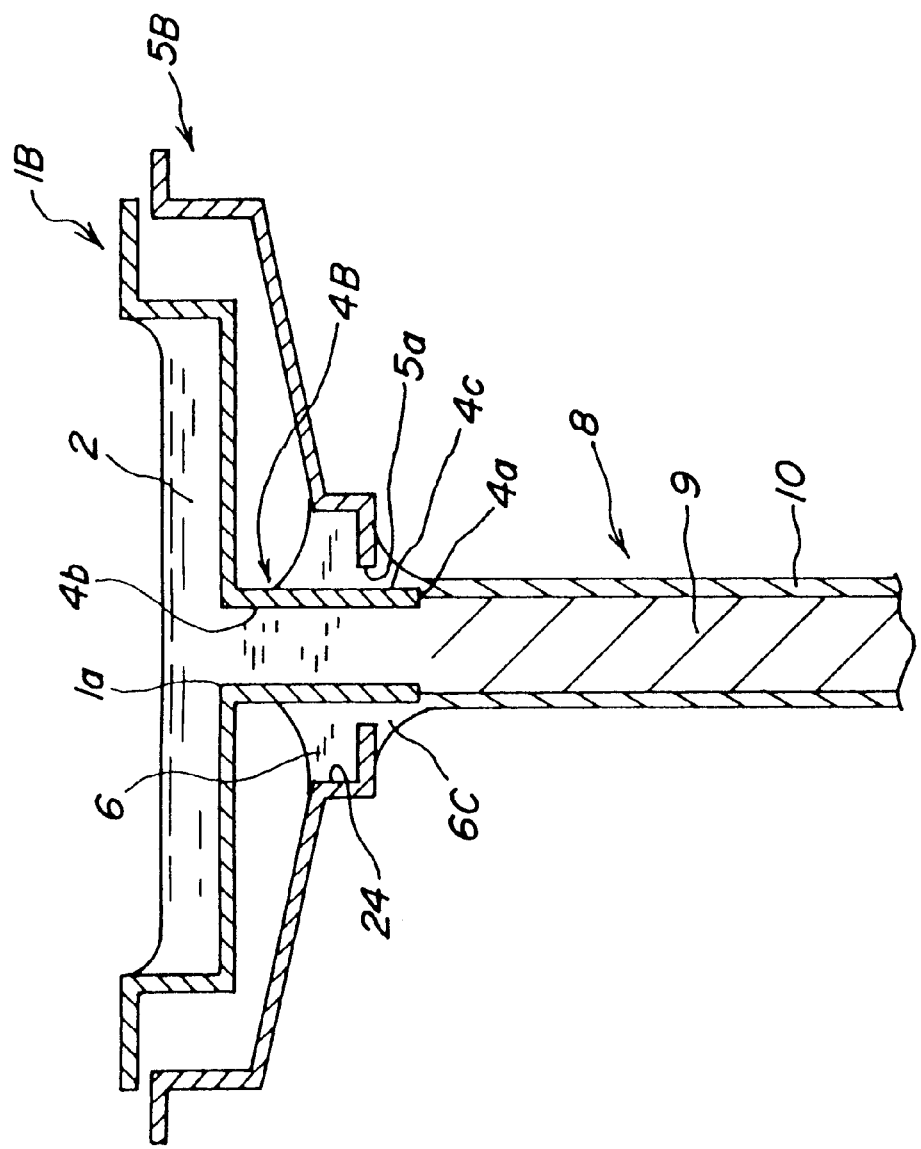

FIG_6a
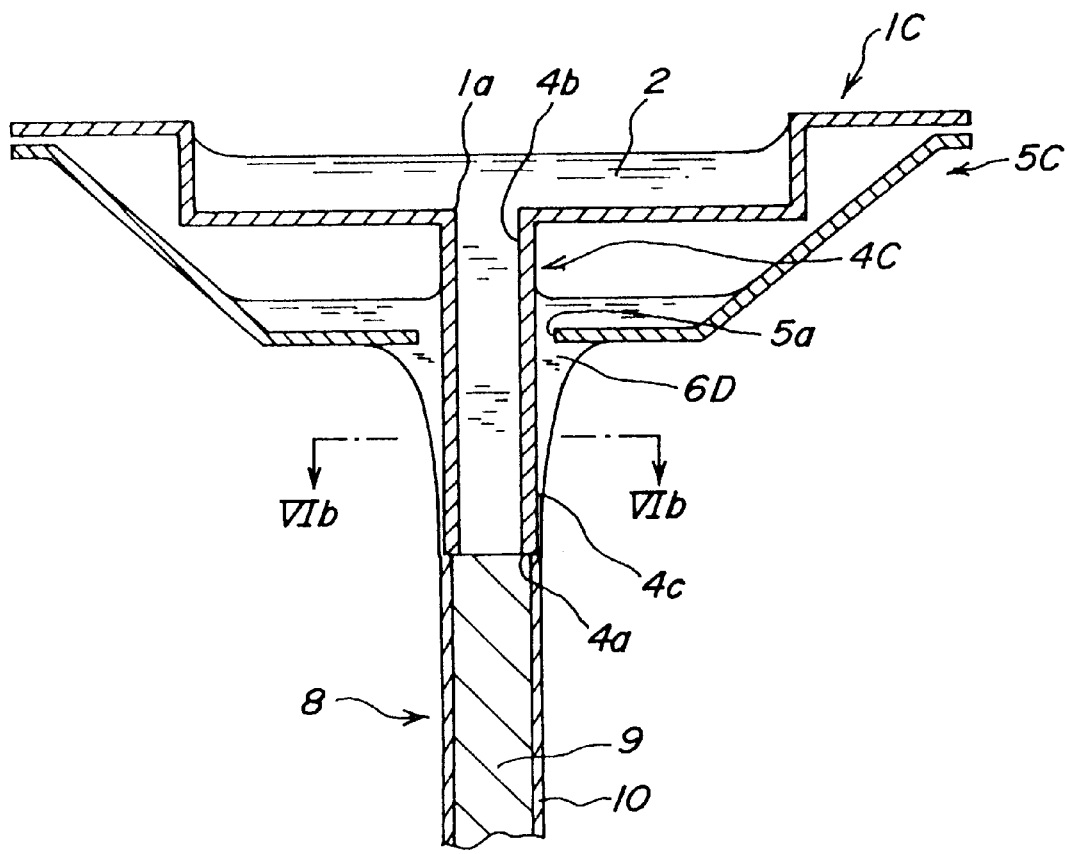
FIG_6b
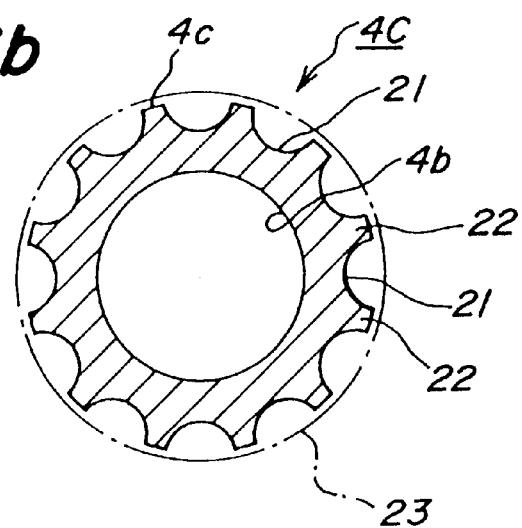

PROCESS AND AN APPARATUS FOR PRODUCING A COMPOSITE OXIDE SINGLE CRYSTAL BODY

BACKGROUND OF THE INVENTION (1) Field of the Invention

The present invention relates to a process and an apparatus for producing a composite oxide single crystal body comprising a core portion and a clad portion in a form of a fiber or plate.

(2) Related Art Statement

Recently, single crystal fibers made of non-linear optical materials have been recognized as active members in the fields of second harmonic generation elements and optical fiber laser elements. As a process for growing an oxide single crystal, a so-called $\mu$ pulling down process has been noted in producing a single crystal fiber. "Densoken News" No. 522, pp 4 to 8, July 1993, Japanese patent application Laid-open No. 4-280891 and Laid-open No. 6-345,588 describe that single crystal fibers made of potassium-lithium niobate $K_3Li_{2-2x}Nb_{5+x}O_{15-+x}$ hereinafter referred to as KLN) or the like were grown by this method. It is shown that the fibrous oxide single crystals grown by the $\mu$ pulling down process have high structural strength and small residual stress (Jap. J. Appl. Phys. 33(1994) p 3510).

It has been desired to develop a process for forming a clad portion around a single crystal fiber having high conversion efficiency for use as a laser. For example, it is reported that a clad layer is formed around an Nd-YAG laser fiber by coating it with glass and that a clad layer having a relatively low refractive index is formed around a surface of a lithium niobate fiber by diffusion, ion exchanging or ion indiffussion implantation.

Further, several trials have been made to control a concentration profile in a single crystal in growing the single crystal from a melt. For example, a process for re-melting a single crystal is known. In this process, a $CO_2$ laser beam is used to grow a fiber made of a single crystal ruby according to a float zone method. According to this method, the content of chromium in the surface layer of the fiber is reduced by 100 times by melting a surface layer of the fiber with a $CO_2$ laser and re-growing this surface layer of the fiber. However, despite this treatment, it is considered that there is hardly a possibility that fiber growth is combined with re-melting of the surface layer of the fiber in one process.

Moreover, a process is available to grow a composite single crystal from two kinds of different doped melts fed. For example, a film of $LiNbO_3$ is grown on a substrate made of $LiTaO_3$ by a capillary liquid phase epitaxial technique (J. Crystal Growth Vol. 50 (1980) pp 291–298). However, the melts diffuse into each other to a large extent, and a transition region is as wide as several mm. Accordingly, it is impossible to realize such a steep change in refractive index as to confine the light.

SUMMARY OF THE INVENTION

It is therefore an object of the present invention to provide a new process for producing a monolithic composite oxide single crystal body composed of a core portion made of an oxide single crystal and a clad portion made of another oxide single crystal having a composition different from that of the oxide single crystal constituting the core portion and integrally laminated on a surface of the core portion.

More specifically, the present invention relates to a process for producing a monolithic composite oxide single crystal body composed of a core portion made of an oxide single crystal and a clad portion integrated with the core portion and made of another oxide single crystal having a composition different from that of the oxide single crystal constituting the core portion, said process comprising the steps of: (1) preparing a first melt in a first crucible by melting a first material for a first oxide single crystal to constitute the core portion inside the first crucible, (2) preparing a second melt inside a second crucible by melting a second material for a second oxide single crystal to constitute the clad portion inside the second crucible, (3) contacting a seed crystal to the first and second melts, at one time, (4) pulling down the first melt through a pull-out opening of the first crucible, (5) pulling down the second melt through a pull-out opening of the second crucible and contacting the pulled-down second melt with a pulled-down portion of the first melt, and (6) integrally pulling down the first and second melts.

Further, the present invention relates to an apparatus for producing the above-mentioned composite single crystal body, comprising (1) a first crucible for preparing a first melt by melting a first material for a first oxide single crystal to constitute the core portion inside the first crucible, (2) a second crucible for preparing a second melt by melting a second material for a second oxide single crystal to constitute the clad portion inside the second crucible, and (3) a pulling-down mechanism for pulling down the first melt through a pull-out opening of the first crucible, pulling down the second melt through a pull-out opening of the second crucible to contact the pulled-down portion of the second melt with a pulled-down portion of the first melt, and pulling down the first and second melts in such a manner that the core portion and the clad portion may be integrated after contacting a seed crystal to the first and second melts at one time. With respect to the pulling-down mechanism, the contents of U.S. Ser. No. 08/628,252, U.S. Ser. No. 08/616, 525 and U.S. Ser. No. 08/702,157 are incorporated by reference into this application.

The present inventors noted the $\mu$ pulling down process, and confirmed that when a seed crystal is brought into contact with the first melt and the second melt at one time, the core portion and the clad portion are integrated and pulled through pulling down the first melt via a pull-out opening of the first crucible, pulling down the second melt via a pull-out opening of the second crucible to contact the pulled-down portion of the second melt with a pulled-down portion of the first melt, and further pulling down the first and second melts. The inventors reached the present invention based on this confirmation.

These and other objects, features and advantages of the invention will be made clearer upon reading of the following description of the invention when taken in conjunction with the attached drawings, with the understanding that some modifications, variations and changes of the same could be made by the skilled person in the art to which the invention pertains.

BRIEF DESCRIPTION OF THE ATTACHED DRAWINGS

For a better understanding of the invention, reference is made to the attached drawings, wherein:

FIG. 1 is a sectional view of an embodiment of a crucible structure of a composite oxide single crystal body-producing apparatus for carrying out the invention process;

FIG. 2(a) is a sectional view of a composite oxide single crystal body 8 as viewed in a plane cut in a longitudinal direction thereof, FIG. 2(b) a sectional view of the composite oxide single crystal body 8 of FIG. 2(a) as viewed in a plane cut in a width direction thereof, FIG. 2(c) a sectional view of another composite oxide single crystal body 12 having a flat-board shape as viewed in a plane cut in a longitudinal direction thereof, and FIG. 2(d) a sectional view of another planar composite oxide single crystal body 12A as viewed in a plane cut in a longitudinal direction thereof;

FIG. 3 is a sectional view of schematically illustrating the entire structure of another composite oxide single crystal body-producing apparatus fit for carrying out the present invention;

FIG. 5 is a sectional view of schematically illustrating the structure of another composite oxide single crystal body-producing apparatus,for carrying out the present invention;

Figure 7:
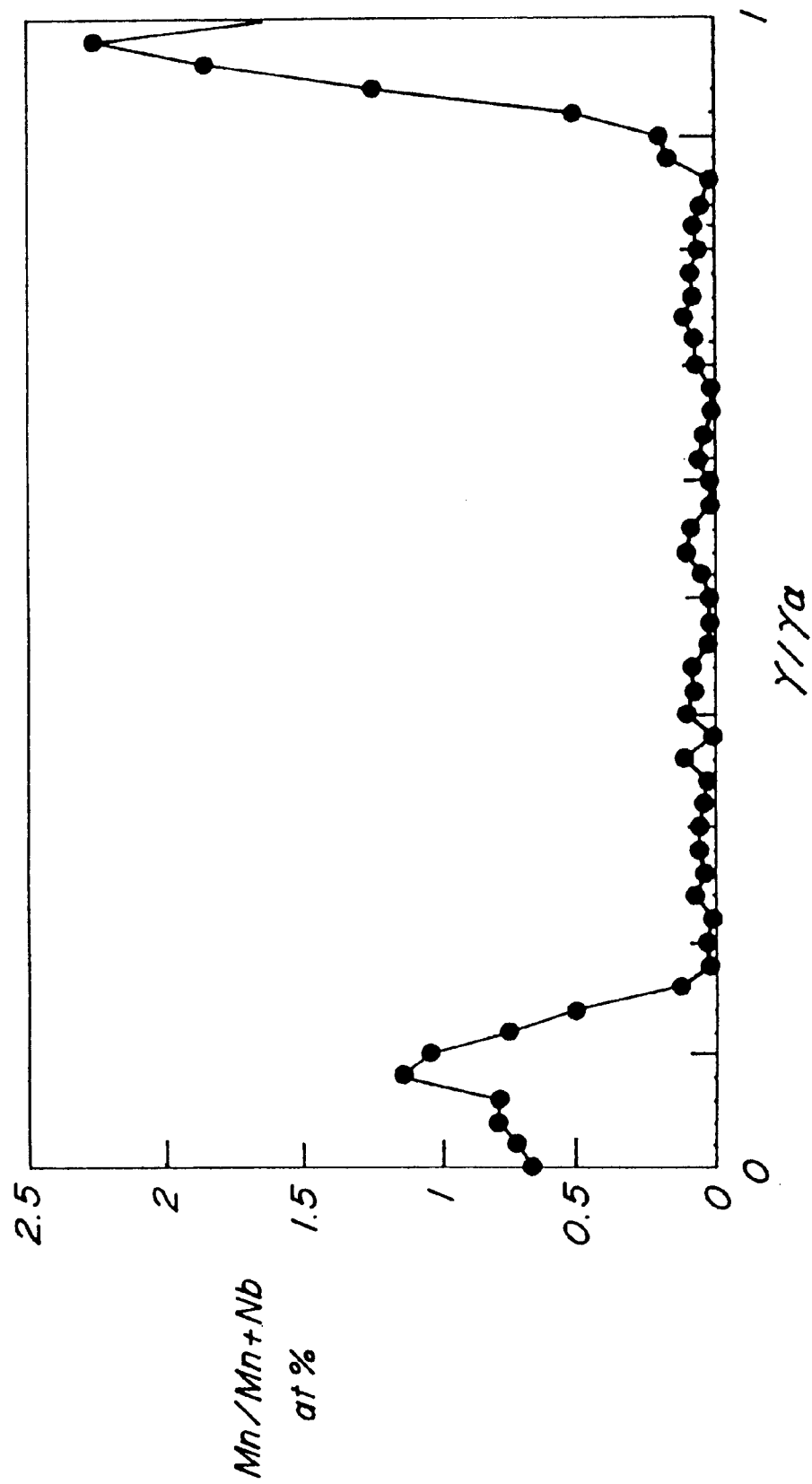

FIGS. 6a and 6b are sectional views of schematically illustrating the structure of another composite oxide single crystal body-producing apparatus for carrying out the present invention; and FIG. 7 is a Mn distribution graph for giving results of Mn contents measured in segments of a composite oxide single crystal body obtained according to the present invention by means of an electron probe microanalyzer.

DETAILED DESCRIPTION OF THE PRESENT INVENTION

Referring more specifically to the present invention, for example, a crucible to be used for melting a material in the $\mu$ pulling down process is changed in design to have a double-walled structure composed of an inner crucible portion and an outer crucible portion, wherein a material for the core portion is placed in the inner crucible portion and that for the clad portion is in the outer crucible portion, a seed crystal is brought into contact with the melts in the outer and inner crucible portions, and the seed crystal is pulled down.

At that time, the composite oxide single crystal body in which the core portion and the clad portion are integrated and which has a dimension and compositions (refractive indexes) as desired can be uniformly grown by appropriately selecting the dimensions of the respective crucibles, the locations of nozzle portions of the respective crucibles, a way of heating each crucible, etc. depending upon the combination of the compositions of the materials for the core portion and the clad portion, their melting points, respectively, and the dimensions of the core portion and the clad portion, respectively.

In a preferred embodiment, the first crucible is provided with a nozzle portion having the above pull-out opening such that the nozzle portion extends downwardly through the pull-out opening of the second crucible. The amount of the raw material inside the first crucible is controlled to such an appropriate level as to match the gravitation at the tip of the nozzle portion with the surface tension of the melt in the upper portion of the first crucible. On the other hand, the amount of the raw material inside the second crucible is controlled to such an appropriate level as to match the gravitation at the gap between the nozzle portion and the inner peripheral wall of the pull-out opening of the second crucible with the surface tension of the melt in the upper portion of the second crucible.

By so constructing, after the first and second materials are melted in the respective crucibles, the capillary nozzle portion is filled with the melt for the core portion, the melt for the clad portion is tentatively stopped inside an opening defined between the nozzle portion and the pull-out opening of the second crucible owing to capillary action, and the outer peripheral surface of the nozzle portion is wetted with the melt for the clad portion.

As a result, the nozzle portion functions as a kind of double die. That is, the melt for the clad portion is fed out downwardly through the pull-out opening due to capillary action, whereas the melt for the clad portion is fed out through the gap defined between the nozzle portion and the pull-out opening of the second crucible owing to capillary action, and the single crystals are simultaneously grown from the respective melts pulled down.

In the present invention, in order to produce a composite oxide single crystal body in which the core portion is surrounded by the clad portion when viewed in a cross sectional plane vertical to a pulling down direction of the single-crystal body, the second melt is pulled down through the second pull-out opening in such a manner that the second melt pulled down may surround a portion of the first melt pulled down through the pull-out opening of the first crucible. Preferably, the core portion in a fibrous form is surrounded with the clad portion.

Further, in order to form a composite oxide single crystal body in which the core portion has a flat-board shape and the clad portion is formed on at least one main plane of the core portion, the second melt pulled down is contacted with the first melt pulled down by pulling down the second melt through the second pull-out opening at at least one side of the first melt pulled down through the first pull-out opening of the first crucible.

If the core portion is of a fibrous form, the core portion having a diameter of 0.1 to 2 mm could be grown, whereas the clad portion having a thickness of 0.01 to 0.5 mm could be grown. If the core portion is of a flat-board form, the core portion having a thickness of 0.1 to 2 mm could be grown, whereas the clad portion having a thickness of 0.01 to 0.5 mm could be grown.

The fibrous composite oxide single crystal body composed of the core portion and the clad portion may be used as a solid state laser element using a rare earth element such as neodymium. The flat-board composite oxide single crystal body composed of the core portion and the clad portion may be used as a slab-shaped solid state laser element. For example, in order to prepare a Nd-YAG laser element, a single crystal material having a diameter of a few to several mm and a length of around 100 mm is used in combination with a semiconductor laser.

On the other hand, in order to miniaturize a laser oscillating element, it is desired that a composite single crystal body is designed to have a diameter of 100 to 1000 $\mu$m, and a core portion and a clad portion are provided in this composite single crystal body so that laser oscillation may be effected, while the light is confined inside the core portion. If such a composite single crystal body is obtained, a laser beam can be generated at a high efficiency by binding or irradiating a semiconductor laser beam into the core portion of the single crystal body in the form of a microchip. In the case of the planar composite single crystal board, the thickness of the composite single crystal body is desirably 100 to 1000 $\mu$m.

According to the present invention, most of composite oxide single crystals may be grown. For example, composite single crystal bodies for laser generating elements, such as lithium niobate, lithium tantalate, lithium niobate-lithium tantalate solid solution single crystal, potassium lithium niobate, potassium niobate, yttrium aluminum garnet, and yttrium vanadate may be grown. Further, composite single crystal bodies for voltage sensors, such as lithium niobate and lithium tantalate may be grown.

In the composite oxide single crystal body for the solid state laser element, a dopant for generating laser beam may be incorporated in the oxide single crystal constituting the core portion. As such a dopant, a rare earth element such as neodymium, erbium or praseodymium, or another element such as titanium or chromium is preferred.

These metal elements are used as dopants in conventional laser single crystals grown by the pulling up process or the like. However, according to the $\mu$ pulling down process, these metallic elements can be doped into the oxide single crystals at high concentrations irrespective of segregation coefficients of the oxide single crystals. By so doing, the laser composite single crystal body having a high conversion efficiency can be grown.

The above will be further explained. For example, if neodymium is to be doped into $LiNbO_3$, neodymium can be incorporated into a grown single crystal only in a rate smaller than that of neodymium in the composition of a mixed melt because its segregation coefficient s not 1. For example, if around 1.0 mole of neodymium is contained in the melt, only around 0.3 mole of neodymium is doped into the single crystal. However, according to a preferred embodiment of the invention process, the core portion having the same composition as that of the melt can be produced without segregation by rapidly cooling the melt inside the nozzle. This may be applied to other laser single crystals such as YAG partially replaced with Nd, Er and/or Yb and $YVO_3$ which is partially replaced with Nd, Er and/or Yb.

Further, in the present invention, a metal element which lowers the refractive index of the oxide single crystal of the clad portion may be incorporated in the clad portion. As such a metal element, magnesium, zinc and nickel may be recited by way of example.

Different from the Czochralski process and the liquid phase epitaxial process, the clad portion having a target composition or a near target composition can be grown irrespective of the oxide single crystal in the above case, too.

Particularly when the growing process according to the present invention is used, it is possible that a change in the composition at an interface portion between the core portion and the clad portion is made steeper, and therefore such a sufficient difference in refractive index between the core portion and the clad portion as to confine the light in the core portion at a high efficiency can be ensured. The reason is that since a large temperature gradient can be ensured in the vicinity of the growing point of the single crystal by simultaneously growing the core portion and the clad portion according to the $\mu$ pulling down process, the oxide single crystal is solidified from the first and second melts, respectively before added metals diffuse into the opposed melts, respectively.

For example, according to JP-A-8 339002, an optical waveguide layer made of potassium lithium niobate (KLN) is to be formed on a substrate made of tantalum-substituted potassium lithium niobate (KLNT), the former having a thickness of around 10 $\mu$m is formed, by the liquid phase epitaxial process, on the latter produced by the $\mu$ pulling down process.

The use of the growing process according to the present invention gives the merit that the structure including the substrate and the optical waveguide layer made of the epitaxial film can be obtained at a time by the $\mu$ pulling down process. In addition to this advantage, there is the following conspicuous advantage. That is, according to the above conventional process, the refractive index varied stepwise between the substrate and the optical waveguide layer. To the contrary, according to the growing process of the present invention, since a boundary layer having a thickness of around 0.1 to 2.0 $\mu$m can be formed, the latitude in the formation of the optical waveguide layer is widened and characteristics of the composite single crystal body such as the width of acceptance angle is enhanced. Owing to this, the present invention makes it possible to produce a second harmonic generation device having a higher efficiency.

Further, it is considered that the difference in refractive index between the core portion and the clad portion can be arbitrarily controlled by changing the structure and dimension of each of the first and second crucibles and the positional relationship between the crucibles in various ways.

In the above, explanation has been made with respect to the case where the present invention is applied mainly to the field of the optical materials, but as a matter of course, the present invention may be applied to the production of articles in other technical fields.

For example, NGK disclosed in JP-A-8 58774 an optical voltage sensor which includes a core portion and a clad portion and is adapted to measure voltage between opposite ends of a fibrous single crystal body by applying the entire voltage of an insulating body such as an elongate insulator to the entire fibrous single crystal.

In this sensor, the temperature characteristic and the piezoelectric characteristic can be improved by changing the composition of each of the core portion and the clad portion. Preferably, the core portion is made of a growth-easy crystal, and a dopant is incorporated in a peripheral portion thereof so that the temperature characteristic and the piezoelectric characteristic of the growth-easy crystal can be improved. It is considered that the crystal which has been formerly grown by the gas phase process such a MOCVD process or the liquid phase process can be easily and stably grown by the above process.

With respect to superconductive composite single crystal bodies, it is considered that superconductivity of the single crystal body can be improved by epitaxially growing a clad portion having a composition different from that of a central core portion simultaneously with the growth of the core portion.

In uses for the above piezoelectric element and superconductive elements, which are different from optical uses, the light is not confined inside the core portion. Therefore, the entire core portion needs not be covered with the clad portion. For example, if a core portion is of a flat-board shape, a clad portion may be formed on one main plane of this planar core.

Figure 1:
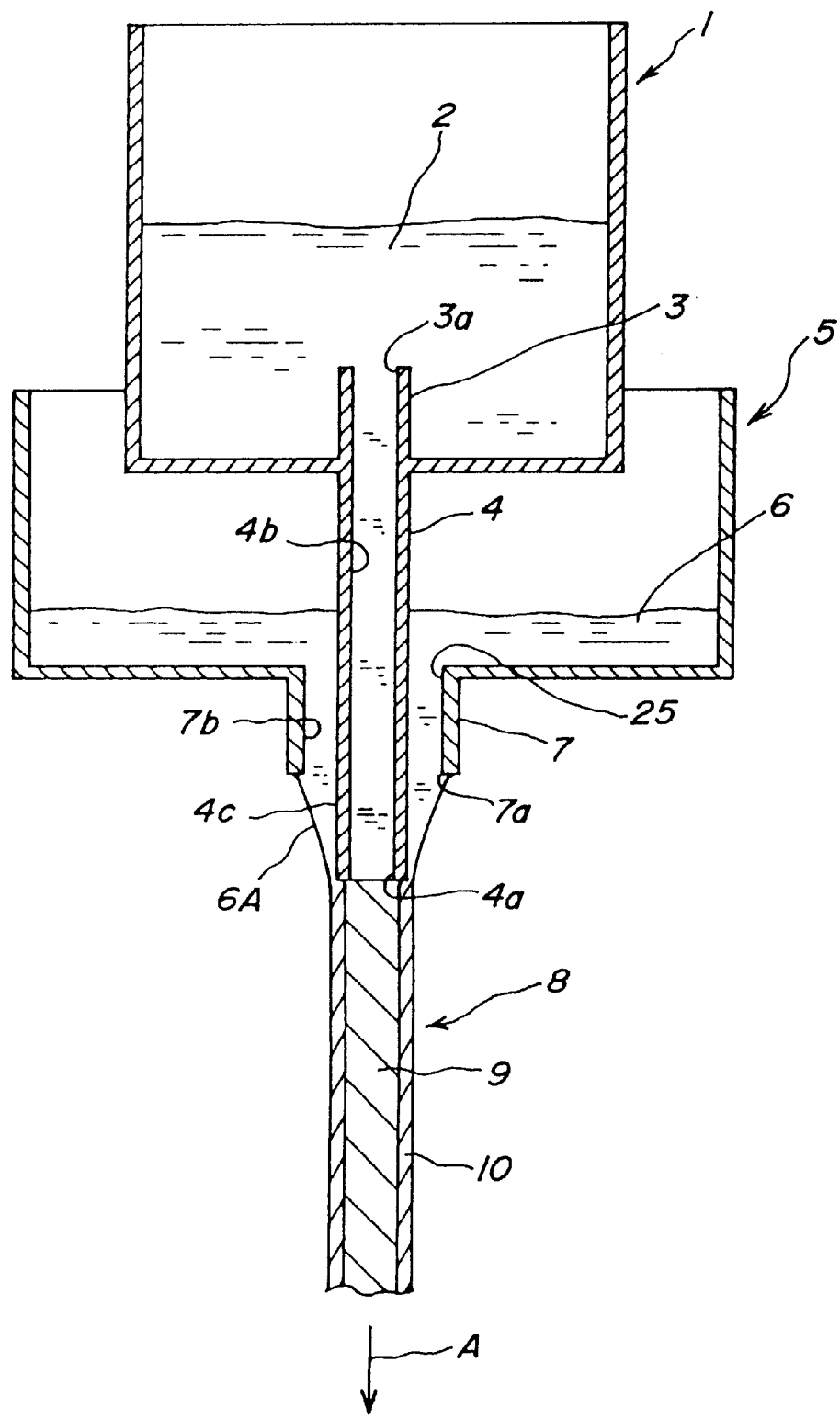
Figure 4:
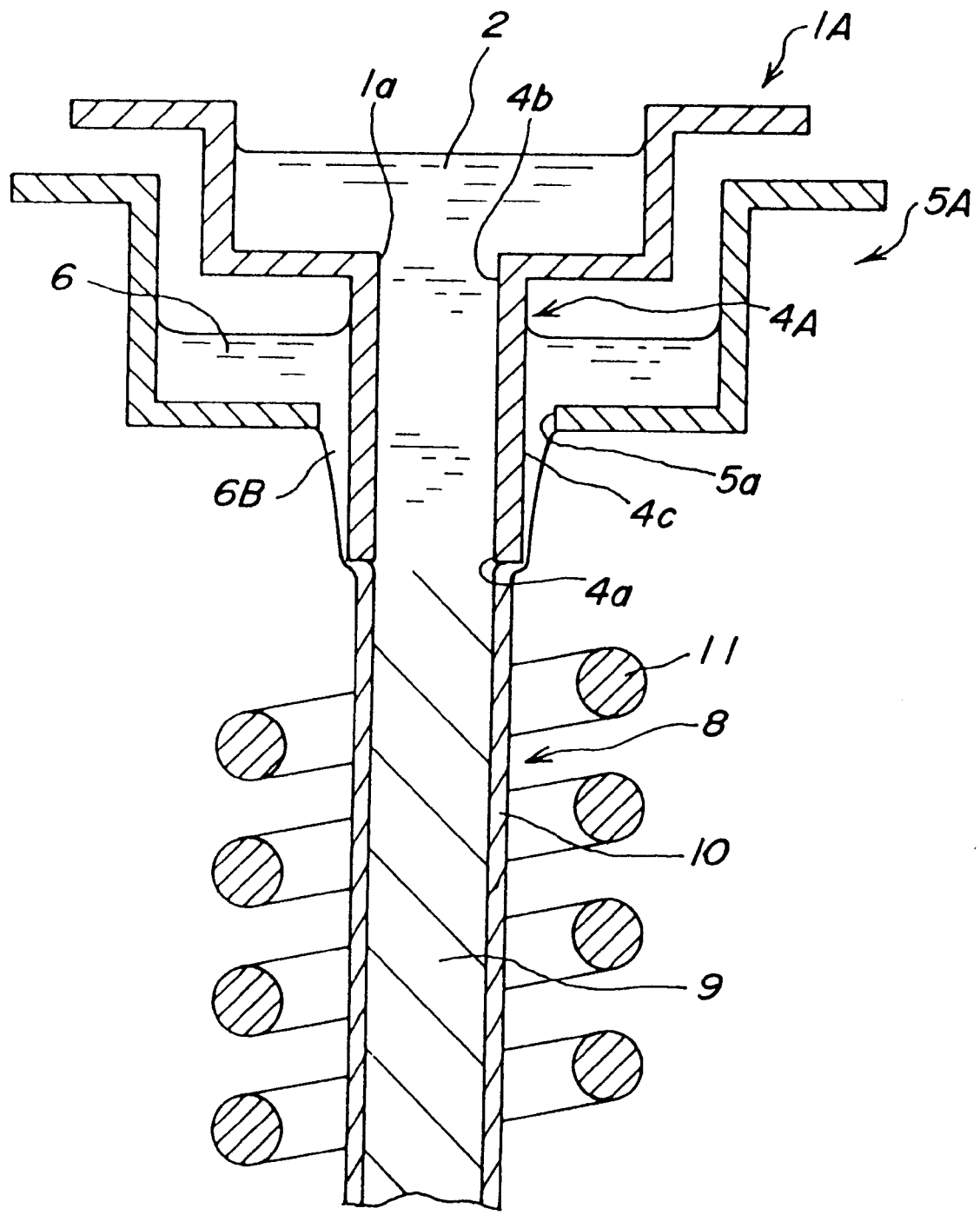
FIG. 4 is a sectional view of schematically illustrating another crucible structure of the composite oxide single crystal body-producing apparatus for carrying out the present invention.

In the following, specific embodiments of the present invention will be explained in more detail with reference to the attached drawings. FIGS. 1 and 4 are schematic sectional views for illustrating the whole crucibles for growing oxide single crystals, respectively. FIGS. 2(*a*) through 2(*d*) are sectional views for illustrating structures of composite oxide single crystal bodies, and FIG. 3 is a schematic view of an entire composite oxide single crystal body-producing apparatus.

A first crucible 1 and a second crucible 5 are arranged inside a furnace body. An upper furnace portion 16 is placed to surround an upper space 15 of the crucibles, and a heater 17 is buried in the upper furnace portion 16. A lower furnace portion 18 is placed to surround a lower space of the crucibles, and a heater 19 is buried in the lower furnace 18. Each of the crucibles 1, 5 is made of a corrosion-resistive conductive material. The configuration of the heating furnace itself may be changed in various ways. For example, although the heating furnace is divided into the two zones in the embodiment of FIG. 3, the heating zone may be divided into three zones or more.

An intake pipe 3 extends upwardly inside the first crucible 1 and, an intake opening 3a is provided at an upper end of the intake pipe 3 so that the intake opening 3a is located slightly above the bottom portion of the crucible 1. Alternatively, such an intake opening 3a may be formed at the bottom portion of the crucible 1. In that case, the intake pipe 3 is omitted.

The second crucible 5 is arranged under the first one 1. A nozzle portion 7 extends downwardly from an intake opening 25 provided at the bottom portion of the second crucible 5. A nozzle portion 4 is continued to the intake pipe 3 through the bottom portion of the crucible 1, and is extended downwardly under the crucible 1. The nozzle portion 4 is passed through the intake opening 25 of the second crucible 5 and an inner space 7b of the nozzle portion 7, and projects downwardly through a pull-out opening 7a of the nozzle portion 7.

In a preferred embodiment, control power sources are independently connected to the first crucible 1, the nozzle portion 4, the second crucible 5 and the nozzle portion 7, respectively, while these control power sources are separated from one another to make it possible for them to independently make their respective controls. By controlling voltages of the control power sources, the temperatures of the first crucible 1, the nozzle portion 4, the second crucible 5 and the nozzle portion 7 are independently controlled. An after heater 11 may be provided in the space 20.

In the present embodiment, the temperature distribution of each of the spaces 15, 20 is appropriately set by generating heat through the upper furnace 16, the lower furnace 18 and the after heater 11. Starting materials for first and second melts 2 and 6 are fed into their corresponding crucibles 1 and 5, and heated by supplying electric power to the crucibles and the nozzle portions.

The first melt 2 flows down through a passage hole 4b of the nozzle portion 4, and is pulled out downwardly through the pull-out opening 4a. In this state, the melt 2 slightly projects outwardly through the pull-out opening 4a of the nozzle portion 4, and is held there by its surface tension to form a relatively flat lower surface. Simultaneously with this, the second melt 6 flows downwardly through a gap between the outer peripheral surface 4c of the nozzle portion 4 and the inner peripheral surface of the nozzle portion 7, and adheres along the outer peripheral surface 4c of the nozzle portion 4 as indicated by 6A. A seed crystal (not shown) is contacted to the lower end portons of these melts, and is moved by rollers (not shown) as shown by an arrow A.

As a result, the second melt 6 is pulled out through the pull-out opening 4a of the nozzle portion 4, and joins the outer peripheral surface of the first melt, thereby producing a composite single crystal body.

As shown in FIGS. 2(a) and 2(b), the composite single crystal body 8 includes a core portion 9 and a clad portion 10. The core portion 9 may be fibrous or flat-board.

Planar composite oxide single crystal bodies 12 and 12A shown in FIGS. 2(c) and 2(d) can be produced by the apparatus as shown in FIG. 3. The single crystal body 12 includes a planar core portion 13 and a clad portion 14 formed on one of main planes of the core portion 13. For this purpose, it is necessary to arrange the pull-out openings of the first and second crucibles adjacent to each other to successively form the clad portion on one of the main planes of the core portion 13.

The composite single crystal body 12A includes a planar core portion 13A, a clad portion 14A formed on one of main planes of the core portion 13A, and another clad portion 14B formed on the other main plane of the core portion 13A.

FIG. 4 is a sectional view for illustrating the structure of another embodiment of the producing apparatus according to the present invention in a vicinity of crucibles. A nozzle portion 4A is provided downwardly at an intake opening 1a at a bottom portion of a first crucible 1A. A second crucible 5A is arranged under the first one 1A. In the present embodiment, a nozzle portion is not provided for the second crucible 5A, and a pull-out opening 5a is provided in the crucible 5A. The nozzle portion 4A is passed through the crucible 5A and the pull-out opening 5a, and projects downwardly through the pull-out opening 5a.

The first melt 2 flows down through a passage hole 4b of the nozzle portion 4, and is pulled out downwardly through the pull-out opening 4a. Simultaneously with this, the second melt 6 flows downwardly through a gap between the inner peripheral surface of the pull-out opening 5a and the outer peripheral surface of the nozzle portion 4A a, and adheres along the outer peripheral surface 4c of the nozzle portion 4 as indicated by 6B. A seed crystal (not shown) is contacted to lower end portion of these melts, and is moved downwardly by rollers (not shown).

FIGS. 5 and 6 are sectional views of illustrating the structures of crucibles according to further embodiments of the present invention, respectively.

In FIG. 5, a nozzle portion 4B is provided downwardly at an intake opening 1a of a bottom portion of a first crucible 1B. A second crucible 5B is arranged under the first crucible 1B. The second crucible 5B is provided with no nozzle portion, and instead a melt reservoir 24 is provided in a bottom portion of the second crucible. A pull-out opening 5a is formed at a lower end portion of the reservoir 24. The nozzle portion 4B is passed through the crucible 5B, the melt reservoir 24 and the pull-out opening 5a, and projected downwardly through the pull-out opening 5a.

The first melt 2 flows down through a passage hole 4b of the nozzle portion 4B, and is pulled out downwardly through a pull-out opening 4a thereof. The second melt 6 flows down through a gap between the inner peripheral surface of the pull-out opening 5a and the outer peripheral surface 4c of the nozzle portion 4B, and adheres along the outer peripheral surface 4c of the nozzle portion 4B under the melt reservoir 24. A seed crystal (not shown) is contacted with lower end portion of these melts, and is moved downwardly, thereby producing a composite oxide single crystal body 8.

In FIG. 6, a nozzle portion 4C is provided downwardly at an intake opening 1a of a bottom portion of a first crucible 1C, and a second crucible 5C is arranged under the first one 1C. The second crucible 5C is provided with neither nozzle portion nor melt reservoir. The nozzle portion 4C is passed through the crucible 5C and a pull-out opening 5a thereof, and projected downwardly through the pull-out opening.

The first melt 2 flows down through a passage hole 4b of the nozzle portion 4C, and is pulled out downwardly through the pull-out opening 4a. Simultaneously with this, the second melt 6 flows down through a gap between the inner peripheral surface of the pull-out opening 5a and the outer peripheral surface 4c of the nozzle portion 4C a, and adheres along the bottom surface of the crucible 5C and the outer peripheral surface 4c of the nozzle portion 4C as indicated by 6D.

Plural rows of grooves 21 are formed at the outer peripheral surface 4c of the nozzle portion 4C in a longitudinal direction of the nozzle 4C, while slender projections 22 are formed between adjacent grooves 21. For example, such grooves 21 may be formed by forming a nozzle preform having a sectional circular shape shown by a single-dotted chain line, and then the grinding or scratching off a surface portion of the nozzle preform with a member made of a material having high hardness, such as a sapphire pin.

By using the nozzle portion having such a outer peripheral contour, a composite oxide single crystal body can be stably produced according to the present invention.

In the following, more specific experimental results will be described.

EXAMPLE 1

Composite single crystal bodies were actually experimentally produced by using the growing apparatus having the entire structure as shown in FIG. 3 with the crucible structure shown in FIG. 4.

More specifically, 2 g of a formulated powder having a composition of neodymium oxide, lithium carbonate and niobium oxide at a molar ratio of 3:47:50 was placed in a first crucible 1A of platinum as shown in FIG. 4. The outer diameter and the inner diameter of the nozzle portion 4A were 0.8 mm and 0.3 mm, respectively.

Into a platinum crucible 5A as shown in FIG. 4 was placed 0.3 g of a formulated powder having a composition of magnesium carbonate, lithium carbonate and niobium oxide at a molar ratio of 3:47:50. The diameter of the bottom of the crucible 5A was 1.0 mm, and the gap between the outer peripheral surface of the nozzle portion 4A and the inner diameter of the pull-out opening of the lower crucible 5A was set at 0.1 mm.

These crucibles were arranged in the single crystal growing furnace as shown in FIG. 3. The temperature of the space in the upper furnace portion was adjusted at 1250° C. to 1350° C., thereby melting the powders in the crucibles 1A and 5A. The temperature of the space in the lower furnace portion was adjusted to 500° C. to 1200° C. Further, current was passed through each of the nozzle portions of the crucibles and the after heater 11, thereby growing a composite oxide single crystal body with the growing points and the temperature gradients of the single crystal being optimized.

As a result, an excellent fibrous composite single crystal body composed of a core portion and a clad portion was successfully grown by adjusting the temperature and the temperature gradients of the growth points of the single crystal at 1200° C. to 1300° C. and 10–50° C./mm, respectively. The diameter of the core portion was 600 μm, and the clad layer was uniformly formed around the outer periphery of the core portion in a thickness of about 50 μm. The diameter and the length of the entire composite single crystal body were 0.7 mm and 15 mm, respectively. An addition amount of neodymium in the core portion was 3%.

By using this composite single crystal body, a laser oscillation experiment was performed by a semiconductor laser. As a result, a diode pumped solid state laser having an output almost equal to that of a conventional single crystal rod (Addition amount of Nd: 1%, diameter: 3 mm, and a length: 50 mm) was obtained.

EXAMPLE 2

The growing apparatus having the entire structure of FIG. 3 with the crucible having the structure of FIG. 4 was used, and a composite oxide single crystal was actually and experimentally produced.

More specifically, about 20 g of a formulated powder having a composition of neodymium oxide, yttrium carbonate and aluminum oxide at a molar ratio of 3:34.5:62.5 was placed in the first crucible 1A of iridium as shown in FIG. 4. The outer diameter and the inner diameter of the nozzle portion 4A were 0.8 mm and 50 mm, respectively.

Into an iridium crucible 5A as shown in FIG. 4 was placed about 3 g of a formulated powder having a composition of yttrium oxide and aluminum oxide at a molar ratio of 37.5:62.5. The diameter of the bottom of the crucible 5A was 1.0 mm, and the gap between the outer peripheral surface of the nozzle portion 4A and the inner diameter of the pull-out opening of the lower crucible 5A was set at 0.1 mm.

These crucibles were arranged in the single crystal growing furnace as shown in FIG. 3. The concentration of oxygen at growing points of a single crystal and their vicinities were adjusted to about 0.1 % by controlling the atmosphere. The temperature of the space in the upper furnace portion was adjusted at 1600° C. to 1700° C., thereby melting the powders in the crucibles 1A and 5A. The temperature of the space in the lower furnace portion was adjusted to 700° C. to 1500° C. Further, current was passed through each of the nozzle portions of the crucibles and the after heater 11, thereby growing a composite oxide single crystal body with the growing points and the temperature gradients of the single crystal being optimized.

As a result, an excellent planar composite single crystal body composed of a core portion and a clad portion was successfully grown by adjusting the temperature and the temperature gradients of the growth points of the single crystal at 1550° C. to 1650° C. and 10–50° C./mm, respectively. The thickness of the core portion was 600 μm, and the clad layer was uniformly formed on both main plane surfaces of the core portion in a thickness of about 50 μm. The thickness, the width and the length of the entire composite single crystal body were 0.7 mm, 30 mm and 30 mm, respectively. An addition amount of neodymium in the core portion was 3%.

By using this composite single crystal body, a laser oscillation experiment was performed by a semiconductor laser. As a result, a diode pumped solid state laser having an output almost equal to that of a conventional single crystal plate (Addition amount of Nd: 1%, thickness 3 mm, width: 50 mm and length: 50 mm) was obtained.

EXAMPLE 3

The growing apparatus having the entire structure of FIG. 3 with the crucible having the structure of FIGS. 6(a) and 6(b) was used, and an experiment for growing a composite oxide single crystal of lithium niobate doped with manganese was effected.

More specifically, a first platinum crucible 1C was designed to have a dimension of 8 mm×2 mm×1.5 mm (which corresponded to 70–80 mg starting material). The outer and inner diameters of the nozzle portion 4C were 0.5 mm/0.4 mm. Grooves 21 were formed on the outer peripheral surface of the nozzle portion 4C by a sapphire pin.

Directions of seed crystal and the nozzle portion were adjusted by a micro X-Y stage, and a fiber-growing process was observed by using an optical microscope. Lithium niobate crystals having a stoichiometric composition by Czochrarski process were placed in the first crucible 1C. Into a second crucible 5C were placed fibers of lithium niobate containing 2 mol % of manganese obtained by the ordinary $\mu$ pulling down process.

These crucibles were arranged in the single crystal growing furnace as shown in FIG. 3. The temperature of the space in the upper furnace portion was adjusted at 1200° C. to 1300° C., thereby melting the powders in the crucibles 1A and 6A. The temperature of the space in the lower furnace portion was adjusted to 500° C. to 1200° C. Further, current was passed through each of the nozzle portions of the crucibles and the after heater 11 made of platinum wire, thereby growing a composite oxide single crystal body with the growing points and the temperature gradients of the single crystal being optimized.

As a result, an excellent fibrous composite single crystal body was successfully grown along a c-axis in air by adjusting the temperature and the temperature gradients of the growth points of the single crystal at 1200° C. to 1300° C. and 10–50° C./mm, respectively. The pulling down speed was set at 12–70 mm/hour.

The thus obtained composite single crystal body had an outer diameter of about 0.4 mm and a length of 50 mm. In a microphotograph of the composite single crystal body grown, typical fibrous configuration and color were observed.

The thus obtained composite single crystal body was placed in a plastic holder, and cut in a direction vertical to the growing direction, thereby obtaining a single crystal segment. The distribution of manganese in this single crystal segment was observed by an electron probe microanalyzer. Results are shown in FIG. 7.

As is seen from FIG. 7, almost no manganese element is seen in a central portion of the single crystal segment (the segment being obtained by cutting the fiber diametrically), and a core portion having a lower content of manganese is formed there. On the other hand, manganese is contained at opposite side portions of the single crystal segment in an amount of about 0.7 to 2.2 atomic %. This clearly shows the production of the clad portion doped with manganese. Change in the content of manganese at an interface portion between the core portion and the clad portion is steep. This shows that the mixed melting and the diffusion of manganese between the first melt and the second melt are extremely suppressed.

EXAMPLE 4

About 20 g of a formulated powder having a composition of potassium carbonate, lithium carbonate, niobium oxide and tantalum oxide at a molar ratio of 30:20:42:8 was placed in a first crucible 1A of platinum as shown in FIG. 4. The nozzle portion was planar, and the outer diameter and the inner diameter of the nozzle portion 4A were 0.8 mm and 30 mm, respectively.

Into one side of an platinum crucible 5A as shown in FIG. 4 was placed about 2 g of a formulated powder having a composition of potassium carbonate, lithium carbonate and niobium oxide at a molar ratio of 30:20:50. The width of the bottom of the crucible 5A was 0.85 mm, and the gap between the outer peripheral surface of the nozzle portion 4A and the inner diameter of the pull-out opening of the lower crucible 5A was set at 0.025 mm.

These crucibles were arranged in the single crystal growing furnace as shown in FIG. 3. The temperature of the space in the upper furnace portion was adjusted at 1100° C. to 1200° C., thereby melting the powders in the crucibles 1A and 5A. The temperature of the space in the lower furnace portion was adjusted to 500° C. to 1000° C. Further, current was passed through each of the nozzle portion of the crucible and the after heater 11, thereby growing a composite oxide single crystal body with the growing points and the temperature gradients of the single crystal being optimized.

As a result, an excellent planar composite single crystal body composed of a core portion and a clad portion was successfully grown by adjusting the temperature and the temperature gradients of the growth points of the single crystal at 1050° C. to 1100° C. and 10–50° C./mm. The thickness of the core portion was 600 $\mu$m, and the clad layer was uniformly formed on one main plane surface of the core portion in a width of about 10 $\mu$m. The interface portion between the core portion and the clad portion was about 1 $\mu$m, and change in composition there was very steep. The clad portion was polished down to a thickness of 5 $\mu$m. Since the refractive index of the clad portion is optically higher than that of the core portion, it will be an optical guidewave layer.

A both end surface-polished planar crystalline body having a dimension of 5 mm×5 mm×0.6 mm was prepared from the planar composite single crystal body having a dimension of 30 mm×30 mm×0.6 mm, and subjected to an experiment as a second harmonic generation element as an invention example. A semiconductor laser having a waveguide of 850 nm was confined upon the optical waveguide layer. The conversion efficiency of the second harmonic generation was measured.

On the other hand, as a control, by using the liquid phase epitaxial process, a film of potassium lithium niobate was formed in a thickness of about 10 $\mu$m on a substrate of potassium lithium niobate substituted with tantalum produced by the $\mu$m pulling down process. This film was polished down to a thickness of 5 $\mu$m, thereby producing a second harmonic generation element. This was also subjected to the same second harmonic generation experiments as in the invention example.

As a result, the second harmonic generation element as the invention example produced the same output as in the control element. Further, comparison in the width of acceptance angle revealed that the element as the invention example had the width of the acceptance angle about 1.5 times as high as that of the control. Therefore, the invention element is more advantageous when assembled in form of an optical waveguide type second harmonic generation device.

As mentioned above, the present invention can provide a new process for producing an integrated composite oxide single crystal body composed of a core portion made of an oxide single crystal and a clad portion made of another oxide single crystal having a composition different from that of the oxide single crystal constituting the core portion.

What is claimed is:

1. A process for producing an integrated composite oxide single crystal body composed of a core portion made of an oxide single crystal and a clad portion integrated with the core portion and made of another oxide single crystal having a composition different from that of the oxide single crystal constituting the core portion, said process comprising the steps of: (1) preparing a first melt in a first crucible by melting a first material for a first oxide single crystal to constitute the core portion inside the first crucible, (2)

preparing a second melt inside a second crucible by melting a second material for a second oxide single crystal to constitute the clad portion inside the second crucible, (3) contacting a seed crystal to the first and second melts, (4) pulling down the first melt through a pull-out opening of the first crucible, (5) pulling down the second melt through a pull-out opening of the second crucible and contacting the pulled-down second melt with a pulled-down portion of the first melt, and (6) integrally pulling down the first and second melts.

2. The producing process set forth in claim 1, which is adapted to produce the composite oxide single crystal body in which the core portion is surrounded by the clad portion when viewed in a cross sectional plane vertical to a pulling down direction of the single-crystal body and wherein the second melt is pulled down through the second pull-out opening in such a manner that the second melt pulled down may surround a portion of the first melt pulled down through the first pull-out opening of the first crucible.

3. The producing process set forth in claim 1, wherein the core portion is of a fibrous form.

4. The producing process set forth in claim 1, which is adapted to produce the composite oxide single crystal body in which the core portion has a flat-board shape and the clad portion is formed on at least one main plane of the core portion and wherein the second melt pulled down is contacted with the first melt pulled down by pulling down the second melt through the second pull-out opening at least one side of the first melt pulled down through the first pull-out opening of the first crucible.

5. The producing process set forth in claim 1, wherein a main crystalline phase of each of the first and second oxide single crystals to constitute the core portion and the clad portion, respectively, comprises a compound selected from the group consisting of lithium niobate, lithium tantalate, lithium niobate-lithium tantalate composite solid solution single crystal, potassium lithium niobate, potassium niobate, yttrium aluminum garnet, and yttrium vanadate.

6. The producing process set forth in claim 3, wherein a main crystalline phase of each of the first and second oxide single crystals to constitute the core portion and the clad portion, respectively, comprises a compound selected from the group consisting of lithium niobate, lithium tantalate, lithium niobate-lithium tantalate composite solid solution single crystal, potassium lithium niobate, potassium niobate, yttrium aluminum garnet, and yttrium vanadate.

7. The producing process set forth in claim 1, wherein the composite oxide single crystal body is a solid state laser, and a dopant for generating a laser beam is incorporated into the oxide single crystal constituting the core portion.

8. The producing process set forth in claim 3, wherein the composite oxide single crystal body is solid a state laser, and a dopant for generating a laser beam is incorporated into the oxide single crystal constituting the core portion.

9. The producing process set forth in claim 5, wherein the composite oxide single crystal body is a solid state laser, and a dopant for generating a laser beam is incorporated into the oxide single crystal constituting the core portion.

10. The producing process set forth in claim 7, wherein the dopant includes at least one metallic element selected from the group consisting of a rare earth element, titanium, or chromium.

11. The producing process set forth in claim 8, wherein the dopant includes at least one metallic element selected from the group consisting of a rare earth element, titanium, or chromium.

12. The producing process set forth in claim 5, wherein the clad portion further comprises a metallic material for lowering a refractive index of the second oxide single crystal.

13. The producing process set forth in claim 6, wherein the clad portion further comprises a metallic material for lowering a refractive index of the second oxide single crystal.

14. The producing process set forth in claim 1, wherein the composite single crystal body is a second harmonic generation element and the core portion and the clad portion have respective compositions which make a refractive index of the core portion different from that of the clad portion.

15. The process set forth in claim 14, wherein the core portion further comprises a metallic element for lowering the refractive index of the oxide single crystal of the core portion.

16. An apparatus for producing an integrated composite oxide single crystal body composed of a core portion made of an oxide single crystal and a clad portion integrated with the core portion and made of another oxide single crystal having a composition different from that of the oxide single crystal constituting the core portion, said apparatus comprising (1) a first crucible for preparing a first melt by melting a first material for a first oxide single crystal to constitute the core portion inside the first crucible, (2) a second crucible for preparing a second melt by melting a second material for a second oxide single crystal to constitute the clad portion inside the second crucible, and (3) a pulling-down mechanism for pulling down the first melt through a pull-out opening of the first crucible, pulling down the second melt through a pull-out opening of the second crucible and contacting the pulled-down portion of the second melt with a pulled-down portion of the first melt, and integrally pulling down the first and second melts in such a manner that the core portion and the clad portion may be integrated, after contacting a seed crystal to the first and second melts.

17. The producing apparatus set forth in claim 16, wherein the first crucible is provided with a nozzle portion having the pull-out opening of the first crucible, and the nozzle portion extends downwardly through the pull-out opening of the second crucible.

18. The producing apparatus set forth in claim 17, wherein plural rows of grooves are formed at the outer peripheral surface of the nozzle portion in a longitudinal direction of the nozzle.

19. The producing process set forth in claim 2, wherein the core portion is of a fibrous form.

20. The producing process set forth in claim 2, wherein a main crystalline phase of each of the first and second oxide single crystals to constitute the core portion and the clad portion, respectively, comprises a compound selected from the group consisting of lithium niobate, lithium tantalate, lithium niobate-lithium tantalate composite solid solution single crystal, potassium lithium niobate, potassium niobate, yttrium aluminum garnet, and yttrium vanadate.

21. The producing process set forth in claim 4, wherein a main crystalline phase of each of the first and second oxide single crystals to constitute the core portion and the clad portion, respectively, comprises a compound selected from the group consisting of lithium niobate, lithium tantalate, lithium niobate-lithium tantalate composite solid solution single crystal, potassium lithium niobate, potassium niobate, yttrium aluminum garnet, and yttrium vanadate.

22. The producing process set forth in claim 2, wherein the composite oxide single crystal body is a solid state laser, and a dopant for generating a laser beam is incorporated into the oxide single crystal constituting the core portion.

23. The producing process set forth in claim 4, wherein the composite oxide single crystal body is a solid state laser, and a dopant for generating a laser beam is incorporated into the oxide single crystal constituting the core portion.

24. The producing process set forth in claim 2, wherein the composite single crystal body is a second harmonic generation element and the core portion and the clad portion have respective compositions which make a refractive index of the core portion different from that of the clad portion.

25. The producing process set forth in claim 4, wherein the composite single crystal body is a second harmonic generation element and the core portion and the clad portion have respective compositions which make a refractive index of the core portion different from that of the clad portion.

26. The process set forth in claim 24, wherein the core portion further comprises a metallic element for lowering the refractive index of the oxide single crystal of the core portion.

27. The process set forth in claim 25, wherein the core portion further comprises a metallic element for lowering the refractive index of the oxide single crystal of the core portion.

* * * * *